United States Patent
Bonzo et al.

(10) Patent No.: US 7,193,886 B2
(45) Date of Patent: Mar. 20, 2007

(54) INTEGRATED CIRCUIT WITH A MEMORY OF REDUCED CONSUMPTION

(75) Inventors: Andréa Bonzo, Froges (FR); Jean-François Pollet, Jarrie (FR)

(73) Assignee: Dolfin Integration, Meylan (FR)

( * ) Notice: Subject to any disclaimer, the term of this patent is extended or adjusted under 35 U.S.C. 154(b) by 0 days.

(21) Appl. No.: 11/010,788

(22) Filed: Dec. 13, 2004

(65) Prior Publication Data

US 2006/0126375 A1    Jun. 15, 2006

(51) Int. Cl.
*G11C 11/00* (2006.01)
(52) U.S. Cl. ...................... 365/154; 365/148
(58) Field of Classification Search ............... 365/154, 365/148

See application file for complete search history.

(56) References Cited

U.S. PATENT DOCUMENTS

| | | | |
|---|---|---|---|
| 5,561,622 A * | 10/1996 | Bertin et al. ............... 365/51 |
| 5,726,562 A | 3/1998 | Mizuno | |
| 5,740,118 A | 4/1998 | Sato et al. | |
| 6,256,252 B1 * | 7/2001 | Arimoto .................. 365/227 |
| 6,304,069 B1 * | 10/2001 | Tatsumi .................. 323/312 |
| 6,307,803 B1 * | 10/2001 | Chien .................... 365/227 |
| 2003/0218915 A1 | 11/2003 | Isono | |

* cited by examiner

*Primary Examiner*—Amir Zarabian
*Assistant Examiner*—Kretelia Graham
(74) *Attorney, Agent, or Firm*—Plevy, Howard & Darcy, PC

(57) ABSTRACT

An integrated circuit comprising volatile memory elements, interface circuits connected to the volatile memory elements and, possibly, logic circuits not connected to the volatile memory elements and comprising first, second, and possibly third separate power supplies, the first power supply being connected to the volatile memory elements, the second power supply being connected to the interface circuits with the memory elements, and the third power supply being connected to other logic circuits.

7 Claims, 1 Drawing Sheet

INTEGRATED CIRCUIT WITH A MEMORY OF REDUCED CONSUMPTION

This application claims the benefit of French Application Ser. No. 03/51194, filed Dec. 24, 2003 and is incorporated herein by reference.

BACKGROUND OF THE INVENTION

1. Field of the Invention

The present invention relates to integrated circuits comprising volatile memory elements and logic circuits associated with the volatile memory elements, especially volatile memory elements comprising logic elements or the like.

2. Discussion of the Related Art

An integrated circuit memory may be formed of an assembly of memory elements, or memory cells, possibly arranged in a matrix. The writing and the reading of data into and from the memory elements are performed by means of dedicated logic circuits. A power supply generally provides the power necessary to the proper operation of the components of the memory elements and of the logic circuits. The memory supply is generally obtained by one or several rails connected to all the memory cells and logic circuits and conveying a supply voltage. A memory is said to be volatile in the case where the data stored in the volatile memory elements risk being lost when the memory supply falls below a minimum threshold. Conversely, a memory is said to be non-volatile when the data stored in the memory are kept even on turning-off of the memory power supply.

In the case of a volatile memory, if the data are desired to be kept even when the integrated circuit is not used, the memory supply must be maintained permanently at a level greater than the minimum data conservation threshold, which corresponds to a so-called inactive operating mode or stand-by mode. This thus results in a consumption of the integrated circuit in inactive mode, called the static consumption.

For certain applications, the integrated circuit consumption is a critical factor. The integrated circuits are for example those equipping a cellular phone supplied by the telephone batteries. Indeed, since the batteries of a cellular phone have a limited capacity, it is desired to reduce to a minimum the integrated circuit consumption, in particular in inactive mode which may correspond to a mode where the phone is completely off or to a mode where the integrated circuit is not requested or to a mode where the volatile memory or the volatile memories are not requested.

SUMMARY OF THE INVENTION

The present invention provides an integrated circuit comprising volatile memory elements and logic circuits enabling reduction of the integrated circuit consumption in inactive mode while ensuring the conservation of the data stored in the volatile memory elements.

To achieve this object, the present invention provides an integrated circuit comprising volatile memory elements and logic interface circuits connected to the volatile memory elements, and comprising first and second separate power supplies, the first power supply being connected to the volatile memory elements and the second power supply being connected to the logic interface circuits.

According to an embodiment of the present invention, the circuit comprises means for turning off the second power supply and for setting the first power supply to a non-zero minimum level capable of ensuring the conservation of the information stored in the volatile memory elements, in a determined operating mode.

According to an embodiment of the present invention, the volatile memory elements comprise MOS transistors of a first type, and the logic interface circuits comprise MOS transistors of a second type, the transistors of the first type having a gate oxide layer greater than the gate oxide thickness of the transistors of the second type or the transistors of the first type each having an active doped channel area for providing leakage currents smaller than for transistors of the second type.

According to an embodiment of the present invention, the circuit comprises means for setting the first and second power supplies to non-zero levels in a determined operating mode, the first power supply being at a level different from the level of the second power supply.

According to an embodiment of the present invention, the circuit comprises additional logic circuits, and a third power supply, separate from the first and second power supplies, connected to the additional logic circuits.

According to an embodiment of the present invention, the circuit comprises means for turning off the third power supply and maintaining the first and second power supplies at a non-zero level in a determined operating mode.

According to an embodiment of the present invention, the circuit comprises means for turning-off the second and third power supplies and setting the first power supply to a non-zero minimum level capable of ensuring the conservation of the information stored in the volatile memory elements in a determined operating mode.

According to an embodiment of the present invention, the additional logic circuits comprise transistors of a third type, the transistors of the first type having a gate oxide thickness greater than the gate oxide thickness of the transistors of the third type or the transistors of the first type each having an active doped channel area for providing leakage currents smaller than for the transistors of the third type, the transistors of the third type having a switching rate greater than the switching rate of the transistors of the second type.

According to an embodiment of the present invention, the circuit comprises means for setting the first, second, and third power supplies to different levels.

The present invention also provides a method for controlling in standby mode an integrated circuit comprising volatile memory elements and interface logic circuits connected to the volatile memory elements, the method comprising the steps of providing a first power supply connected to the volatile memory elements; providing a second power supply, separate from the first power supply, connected to the logic interface circuits; and turning-off the second power supply and setting the first power supply to a non-zero minimum level capable of ensuring the conservation of the information stored in the volatile memory elements.

The foregoing object, features, and advantages of the present invention, as well as others, will be discussed in detail in the following non-limiting description of specific embodiments in connection with the accompanying drawings.

DETAILED DESCRIPTION

Generally, the present invention provides separating the power supply of the volatile memory elements from the power supply of the other integrated circuit elements. As described in further detail hereafter, by differently varying the levels of the power supplies in inactive mode, the static consumption of the integrated circuit can be decreased. Further, the separation of the power supplies enables using transistors of a given type for the volatile memory elements and transistors of a different type for the other integrated circuit elements. Such a separation of the power supplies may be carried on at the level of the elements other than the volatile memory elements as will be illustrated hereafter. Separate power supplies may for example be provided for the logic circuits interfacing with the volatile memory elements and the other integrated circuit logic circuits.

Figure 1:
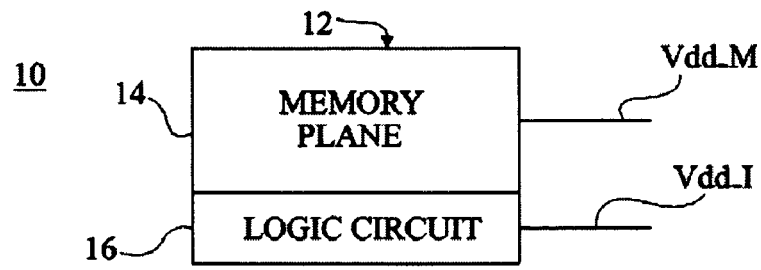
FIG. 1 very schematically shows a volatile memory of an integrated circuit according to the present invention.

As shown in FIG. 1, an integrated circuit 10 according to the present invention contains a volatile memory 12 which is shown, for illustration, as a memory plane 14 and a logic interface circuit 16. Memory plane 14 is for example formed of a matrix of volatile memory elements. Logic interface circuit 16 comprises all the components capable of addressing the volatile memory elements to write or read data into and from the volatile memory elements. According to the present invention, memory 12 is connected to two separate power supplies. In the present example, a power supply corresponds to a supply voltage or to the couple formed by a supply voltage and a reference voltage, currently ground GND. A first supply voltage Vdd_M is supplied to memory plane 14 and a second supply voltage Vdd_I is supplied to logic interface circuit 16. Supply voltages Vdd_M and Vdd_I can be independently controlled and, in particular, set to different values.

Figure 2:
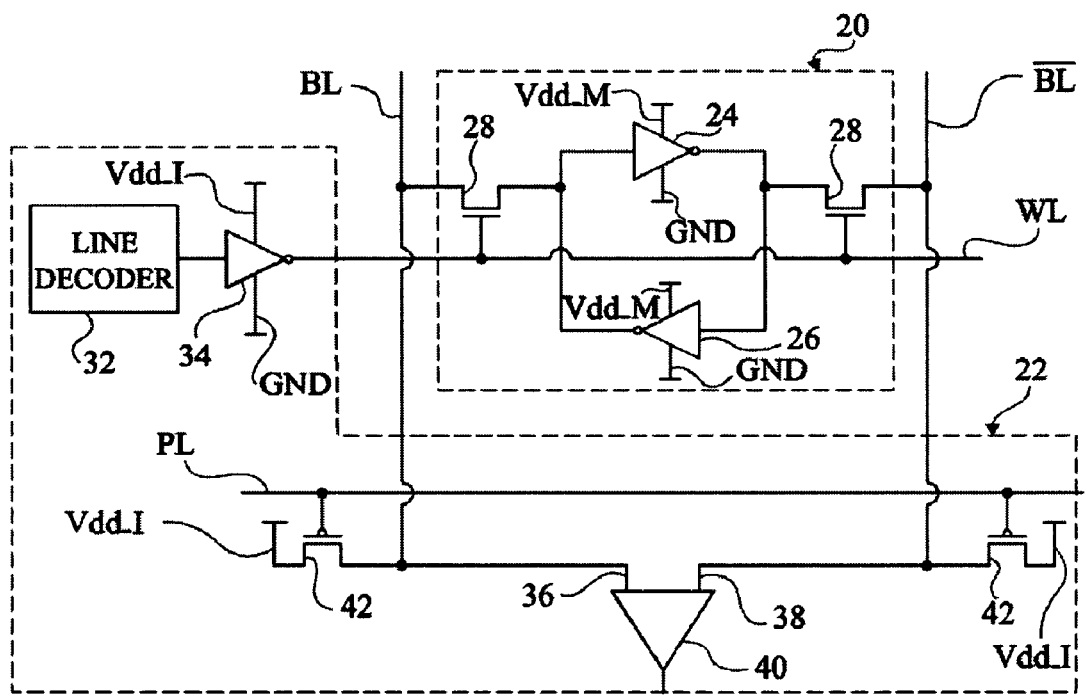
FIG. 2 shows a more detailed example of embodiment of the volatile memory of FIG. 1 and of the associated logic circuits.

FIG. 2 shows in more detailed fashion a volatile memory element 20 of memory plane 14 of FIG. 1 and components 22 of logic interface circuit 16 used for the writing and/or the reading of data into and from volatile memory element 20. The shown volatile memory element 20 is an element of a static memory of random access type (SRAM) and comprises inverters 24, 26 connected in antiparallel. The respective inputs of inverters 24, 26 are connected to respective bit lines BL, $\overline{BL}$ via switches 28 controlled by a row selection signal conveyed by a word line WL. Each inverter 24, 26 is supplied by a high voltage Vdd_M and reference voltage GND. A volatile memory element 20 may be formed of six MOS transistors, each inverter 24, 26 comprising two complementary MOS transistors.

Components 22 of logic interface circuit 16 comprise a line decoder 32 connected to an inverter 34 which provides the row selection signal conveyed by word line WL. Bit lines BL and $\overline{BL}$ form inputs 36, 38 of a sense amplifier 40. Inputs 36, 38 of amplifier 40 are connected to voltage Vdd_I via precharge transistors 42 controlled by a precharge signal conveyed by a precharge line PL.

To write an information into memory element 20, voltage Vdd_M is for example applied on one of bit lines BL or $\overline{BL}$ and voltage GND is applied on the other one. Switches 28 are then on, to set the state of the inputs and outputs of inverters 24, 26. Switches 28 are then turned off and the state of the signals across inverters 24, 26 is maintained.

To read an information from the memory element, each bit line BL and $\overline{BL}$ is, for example, precharged to a voltage ranging between voltages Vdd_M and GND, after which switches 28 are turned on so that the voltages on the bit lines vary according to the state of the signals across inverters 24, 26. Sense amplifier 40 provides a binary information relative to the information kept in volatile memory element 20.

The present invention provides a control independent from supply voltages Vdd_M and Vdd_I. In normal operation, or in active mode, supply voltages Vdd_M and Vdd_I each have a nominal level. In inactive mode, which corresponds in the present example to an operation of the integrated circuit in which memory 12 is not requested, the power supply of logic interface circuit 16 may be interrupted, which corresponds to a setting to zero of voltage Vdd_I. The power supply of memory plane 14 is not interrupted to avoid loosing the information stored in memory plane 14. However, supply voltage Vdd_M may be decreased with respect to the active level down to a minimum level for which data are not lost.

A decrease in the static consumption of memory 12 is thus obtained since there are no more losses at the level of logic interface circuit 16 in inactive mode.

Since supply voltages Vdd_M and Vdd_I of memory plane 12 and of logic interface circuit 16 may be of different levels, the present invention enables using MOS transistors of different types for volatile memory elements 20 of memory plane 14 and for logic interface circuit 16. Indeed, according to the envisaged MOS transistor manufacturing technologies, different types of transistors are generally provided to the designers of integrated circuits according to whether they privilege a high transistor switching rate or low leakage currents. As an example, there generally exist, in all MOS transistor manufacturing technologies, transistors called interface transistors or high-voltage transistors, which have a greater gate oxide thickness than the gate oxide thickness of the other transistors manufactured according to the same technology, and which will be called thin-gate transistors hereafter. Further, the high-voltage transistors are generally controlled by gate voltages greater than the voltages used with thin-gate MOS transistors. The leakage currents which appear with a high-voltage transistor are smaller than for a thin-gate transistor. However, the switching rate of a high-voltage transistor is generally lower than that of a thin-gate transistor. Generally, thin-gate transistors are used to form the logic circuits and memories of an integrated circuit. High-voltage transistors are usually used to form the interface between the digital and analog parts of an integrated circuit.

As an example, in the case of a 0.13-micrometer technological MOS process, four different transistor types, among which three types have the same gate oxide thickness and have different dopings than the active channel region according to whether an increase in the switching rate or a decrease in leakage currents are privileged, are generally available. The fourth type corresponds to the high-voltage transistor which has a larger gate thickness.

According to the present invention, high-voltage transistors are used to form volatile memory elements 20 of memory plane 14. The decrease in the leakage currents at the level of memory plane 14 is thus privileged. The use of faster thin-gate transistors is further maintained for logic interface circuit 16. It is considered that the loss in switching rate due to the use of high-voltage transistors does not adversely affect the general operation of memory 12. To optimize the dynamic performances of high-voltage transistors, voltage Vdd_M is however selected to be greater than voltage Vdd_I in active mode. Logic interface circuit 16 is thus formed of fast transistors supplied by a supply voltage Vdd_I which is cut-off in inactive mode.

The use of high-voltage transistors thus enables additional decrease in the consumption of memory 12, obtained both in active mode and in inactive mode. Indeed, the applicant has shown that even when supply voltage Vdd_M does not vary between the active mode and the inactive mode and supply voltage Vdd_I varies between a nominal value in active mode and the zero value in inactive mode, a decrease in the consumption of memory 12 is obtained with respect to an analog structure in which only thin-gate transistors are used.

Preferably, as described previously, it is advantageous to decrease supply voltage Vdd_M in inactive mode to reduce to a maximum the static consumption of memory 12. As an example, for a 0.18-micrometer technology, a supply voltage Vdd_M substantially equal to 3.3 volts in active mode and to 0.9 volt in inactive mode and a supply voltage Vdd_I substantially equal to 1.8 volts in active mode and substantially zero in inactive mode may be used.

However, for certain applications, it may be preferably to maintain supply voltage Vdd_M at a high level, even in inactive mode. Indeed, especially for applications to cellular telephony, a single battery which directly provides supply voltage Vdd_M in active mode and which is connected to a voltage step-down regulator to provide supply voltage Vdd_I is generally provided. In inactive mode, to provide a decreased supply voltage Vdd_M, it would be necessary to use a voltage step-down regulator, the operation of which would result in a greater overconsumption than the consumption gains obtained by decreasing supply voltage Vdd_M.

Figure 3:
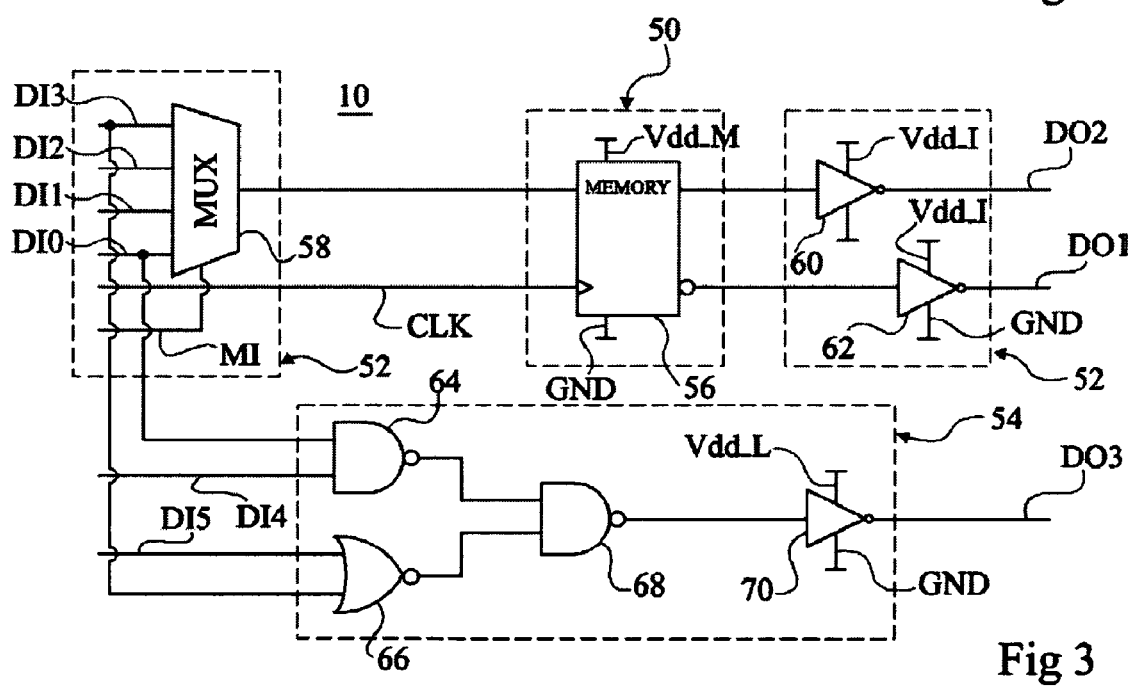
FIG. 3 shows another example of embodiment of an integrated circuit according to the present invention.

FIG. 3 shows another example of embodiment of the present invention in which integrated circuit 10 comprises a volatile memory element 50, interface circuits 52 connected to volatile memory element 50, and a logic circuit 54 performing logic operations with no direct relation with the operation of volatile memory element 50. As an example, volatile memory element 50 is formed of a flip-flop 56 controlled by a clock signal CLK. Interface circuits 52 comprise a multiplexer 58 comprising four inputs DI0, DI1, DI2, and DI3, receiving a selection signal MI, and providing one of input signals DI0 to DI3 to flip-flop 56. Interface circuits 52 comprise two inverters 60, 62 receiving two complementary output signals provided by flip-flop 56. Inverters 60, 62 provide output data DO1 and DO2. Logic circuit 54 comprises a logic NAND gate 64 receiving signals DI0 and DI4 and a logic NOR gate 66 receiving signal DI3 and an input signal DI5. A logic NAND gate 68 receives the outputs of logic gates 64, 66. The output of logic gate 68 is provided to an inverter 70 which provides an output signal DO3.

In the present example of embodiment, three separate power supplies Vdd_M, Vdd_I, and Vdd_L are respectively provided for volatile memory element 50, interface circuits 52, and logic circuit 54. The static consumption of integrated circuit 10 is decreased in inactive mode, by setting to zero supply voltages Vdd_I and Vdd_L of interface circuits 52 and of logic circuit 54 and by maintaining supply voltage Vdd_M equal to a minimum voltage for which data are not lost for volatile memory element 50.

Further, according to the present example of the present invention, three different transistor types may be used. High-voltage transistors resulting in small leakage currents are used for non-volatile memory element 50. Thin-gate transistors are used for interface circuits 52 and logic circuit 54. For example, according to the desired aim, the use of thin-gate transistors having a high switching rate will be privileged for logic circuit 54 and thin-gate transistors with a small leakage current will be privileged for interface circuits 52. The three separate power supplies Vdd_M, Vdd_I, and Vdd_L are thus each associated with a specific transistor family.

The level of each power supply can be independently modified. An example of sequencing is the following:

a. In active mode, the three supply voltages are set to a nominal value. Supply voltage Vdd_M is greater than supply voltage Vdd_I, itself greater than supply voltage Vdd_L, which is greater than zero. The speed performances of integrated circuit 10 which essentially depend on the speed performances of logic circuit 54 are then optimized.

b. In degraded mode, only supply voltages Vdd_M and Vdd_I are at the nominal value. Supply voltage Vdd_L is set to zero. Such a mode corresponds for example to the case where only certain functions of integrated circuit 10 using volatile memory element 50 must be maintained. For an application to cellular telephony, it may be a case where a number stored in a memory of the cellular phone is consulted, which operation does not require all the phone calculation resources. The transistors used for interface circuit 52 being defined to limit leakage currents, the global consumption of integrated circuit 10 is then decreased.

c. In inactive mode, only supply voltage Vdd_M is different from zero. Supply voltages Vdd_I and Vdd_L are set to zero. A minimum static consumption is thus ensured.

According to a variation of the present invention, the integrated circuit may comprise non-volatile memory elements and a power supply connected to the non-volatile memory elements separate from the power supply of the volatile memory elements. It is for example the same power supply connected to the logic circuits interfacing with the volatile memory. The power supply connected to the non-volatile memory elements is then cut-off in inactive mode.

In the previously-described examples of embodiment, the volatile memory elements are logic volatile memory elements. Clearly, the volatile memory elements may be analog volatile memory elements and the associated circuits may indifferently be of logic or analog type.

In the previously-described examples of embodiment, the interface circuits connected to the volatile memory elements are logic interface circuits. Clearly, the interface circuits may be analog interface circuits or compound analog and digital interface circuits.

In the example of embodiment shown in FIG. 3, three separate power supplies Vdd_M, Vdd_I, and Vdd_L are described, respectively for volatile memory element 50, interface circuit 52, and logic circuit 54. Clearly, a larger number of separate power supplies may be provided. For example, in the case where different logic circuits other than the interface circuit are present, several different power supplies, independently controllable (in addition to the power supplies provided for the volatile memory element and the interface circuits) may be used to supply such logic circuits.

The present invention has many advantages:

first, it enables improving the performances in terms of consumption at least in inactive mode according to a gain that may reach and exceed one thousand;

second, by the selection of appropriate transistors and supply levels, it enables improving the integrated circuit performances in terms of consumption in active and inactive mode; and third, by the selection of appropriate transistors and supply voltages, it enables improving the speed performances of the logic circuits which require it.

Of course, the present invention is likely to have various alterations, improvements, and modifications which will readily occur to those skilled in the art. In particular, the power supplies may consist of settable current sources. Further, in the previously-described examples, the reference voltage is the same for the volatile memory, the logic interface circuit, and logic circuit 54. This is not a necessary condition and the volatile memory, the logic interface circuit, and logic circuit 54 may be connected to different reference voltages.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising:
    volatile memory elements comprising MOS transistors of a first type,
    logic interface circuits connected to the volatile memory elements and comprising MOS transistors of a second type different from the first type,
    first and second separate power supplies, the first power supply being connected to the volatile memory elements and the second power supply being connected to the logic interface circuits,
    additional logic circuits, and
    a third power supply, separate from the first and second power supplies, connected to the additional logic circuits,
    wherein, in a first operating mode, the third power supply is turned off and the first and second power supplies are maintained at a non-zero level.

2. The integrated circuit of claim 1, wherein, ma second operating mode, the first, second, and third power supplies are set to different levels.

3. The integrated circuit of claim 1, wherein the transistors of the first type have leakage currents smaller than the transistors of the second type.

4. The integrated circuit of claim 2, wherein, in a third operating mode, the second and third power supplies are turned off and the first power supply is set to a non-zero level.

5. The integrated circuit of claim 1, wherein the additional logic circuits comprise MOS transistors of a third type different from the first type and the second type.

6. The integrated circuit of claim 5, wherein the transistors of the first type have leakage currents smaller than the transistors of the third type.

7. The integrated circuit of claim 5, wherein the transistors of the third type having a switching rate greater than the switching rate of the transistors of the second type.

* * * * *

UNITED STATES PATENT AND TRADEMARK OFFICE
CERTIFICATE OF CORRECTION

PATENT NO. : 7,193,886 B2 Page 1 of 1
APPLICATION NO. : 11/010788
DATED : March 20, 2007
INVENTOR(S) : Andrea Bonzo and Jean-Francois Pollet It is certified that error appears in the above-identified patent and that said Letters Patent is hereby corrected as shown below:

Col. 8, lines 7-9,
Please correct claim 2 to read --The integrated circuit of claim 1, wherein, in a second operating mode, the first, second, and third power supplies are set to different levels.--

Signed and Sealed this

Twenty-sixth Day of August, 2008

JON W. DUDAS
*Director of the United States Patent and Trademark Office*